United States Patent
Su

(10) Patent No.: US 7,615,799 B2
(45) Date of Patent: Nov. 10, 2009

(54) LIGHT-EMITTING DIODE PACKAGE STRUCTURE

(75) Inventor: Wen-Lung Su, Nantou County (TW)

(73) Assignee: LightHouse Technology Co., Ltd., Hsin-Chu (TW)

( * ) Notice: Subject to any disclaimer, the term of this patent is extended or adjusted under 35 U.S.C. 154(b) by 268 days.

(21) Appl. No.: 11/675,431

(22) Filed: Feb. 15, 2007

(65) Prior Publication Data
US 2008/0128738 A1   Jun. 5, 2008

(30) Foreign Application Priority Data
Dec. 4, 2006   (TW) ............................... 95221308 U

(51) Int. Cl.
*H01L 33/00*   (2006.01)
(52) U.S. Cl. ................. 257/99; 257/100; 257/E33.057; 257/E33.058; 362/294; 362/373; 362/184; D13/180
(58) Field of Classification Search .................. 257/99, 257/797, E33.056–E33.058; 362/294, 373, 362/841, 84, 184; D13/180
See application file for complete search history.

(56) References Cited
U.S. PATENT DOCUMENTS

D504,116 S   *   4/2005   Ishida ....................... D13/180
6,943,433 B2  *   9/2005   Kamada ...................... 257/666
D510,326 S   *  10/2005   Ishida ....................... D13/180
2004/0000867 A1 *  1/2004   Chen .......................... 313/512
2005/0156187 A1 *  7/2005   Isokawa et al. ............. 257/100
2005/0269587 A1 * 12/2005   Loh et al. ..................... 257/99
2006/0193121 A1 *  8/2006   Kamoshita ................... 362/84

* cited by examiner

*Primary Examiner*—A. Sefer
*Assistant Examiner*—Allen L Parker
(74) *Attorney, Agent, or Firm*—J.C. Patents

(57) ABSTRACT

A light-emitting diode (LED) package structure including an encapsulant, a carrier, and an LED chip is provided. The encapsulant has a cavity located in a front end of the encapsulant. The carrier includes a die pad, a heat spreader, and a plurality of leads. The die pad is disposed on the encapsulant and located in the cavity. The heat spreader is connected with the die pad, and passes through the encapsulant to extend outside the cavity, and further extends toward a rear end of the encapsulant. The leads pass through the encapsulant and extend outside the cavity. The LED chip is disposed on the die pad, and is electrically connected to the leads. Heat generated when the LED chip emits light is conducted to the heat spreader via the die pad, so as to conduct the heat outside the encapsulant, and to further reduce the temperature of the LED chip.

10 Claims, 5 Drawing Sheets

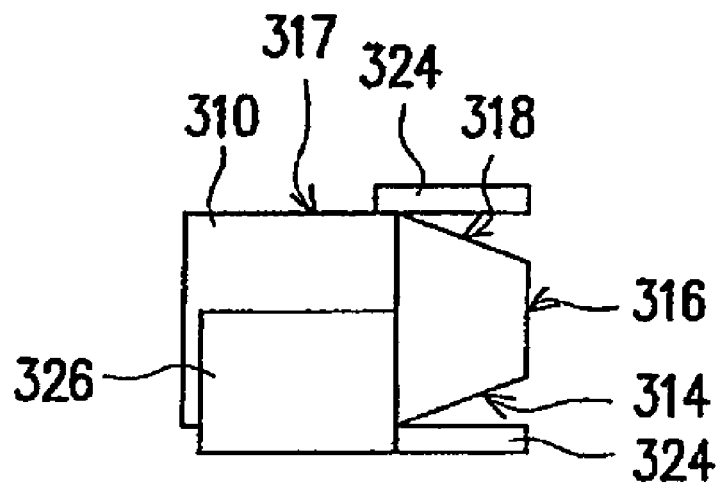
FIG. 5      300d
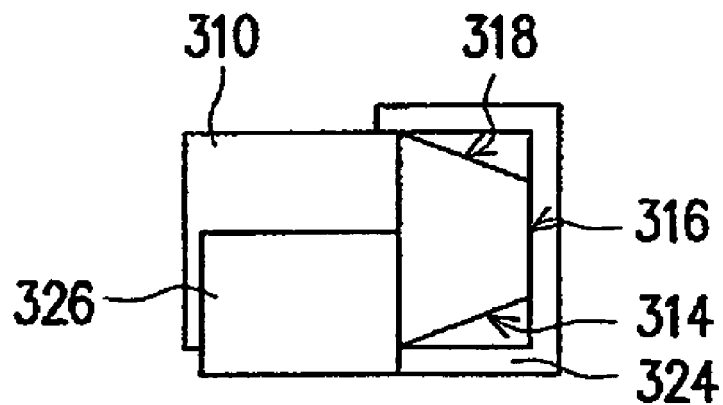
FIG. 6      300e

LIGHT-EMITTING DIODE PACKAGE STRUCTURE

CROSS-REFERENCE TO RELATED APPLICATION

This application claims the priority benefit of Taiwan application serial no. 95221308, filed Dec. 4, 2006. All disclosure of the Taiwan application is incorporated herein by reference.

BACKGROUND OF THE INVENTION

1. Field of the Invention

The present invention relates to a light-emitting diode (LED) package structure. More particularly, the present invention relates to a surface mount device (SMD) type LED package structure.

2. Description of Related Art

Due to the advantages of long lifetime, small size, vibration resistance, low heat emission, and low power consumption, LEDs have been widely applied in various home appliances and instruments as indicators or light sources. In recent years, the LEDs are developed to be multi-colored and high luminance, so the application scope of the LEDs has been extended to mega-size outdoor display boards and traffic lights and the like, and the LEDs can even replace tungsten lights and mercury lights to serve as illuminating light sources that are both power saving and environment friendly.

FIGS. 1A and 1B are a schematic front view and a schematic side view of a conventional SMD type LED package structure respectively, and FIG. 1C is a schematic sectional view taken along a section line I-I' of FIG. 1A. Referring to FIGS. 1A-1C, an LED package structure 100 includes an encapsulant 110, a carrier 120, an LED chip 130, and a transparent colloid 140. The encapsulant 110 includes a cavity 112 located in a front end of the encapsulant 110, and the carrier 120 includes a die pad 122 and two leads 124. The die pad 122 is disposed on the encapsulant 110 and located in the cavity 112, and the leads 124 pass through the encapsulant 110 and extend outside the cavity 112. Moreover, the LED chip 130 is disposed on the die pad 122, and is electrically connected to the leads 124. In addition, the transparent colloid 140 is filled in the cavity 112, so as to encapsulate the LED chip 130, the die pad 122, and a portion of the leads 124 exposed by the cavity 112.

Furthermore, the leads 124 of the LED package structure 100 are suitable for being connected to a bonding pad 210 of a substrate 200 through a solder material 220 (as shown in FIG. 1B), such that the LED chip 130 is electrically connected to the substrate 200 through the leads 124. At this time, the LED chip 130 is suitable for receiving a current through the leads 124 to emit light.

It should be noted that when the LED chip 130 receives the current to emit light, the temperature of the LED chip 130 rises. In the conventional art, the die pad 122 is connected to one of the leads 124 to prevent the high temperature that influences the lifetime of the LED chip 130. At this time, the heat generated when the LED chip 130 emits the light is conducted out of the encapsulant 110 through the lead 124 connected with the die pad 122, so as to reduce the temperature of the LED chip 130.

However, in the conventional art, the leads 124 are mainly designed to serve as electrodes exposed outside the encapsulant 110 of the LED chip 130 instead of dissipating heat, and the surface area of the leads 124 exposed outside the encapsulant 110 is small. Therefore, the heat dissipation effect of the conventional LED package structure 100 is unsatisfactory, and the lifetime of the LED chip 130 is also influenced as the temperature is too high.

SUMMARY OF THE INVENTION

The present invention provides an LED package structure, so as to improve the heat dissipation efficiency of an LED chip, and further to extend the lifetime of the LED chip.

The present invention provides an LED package structure, which comprises an encapsulant, a carrier, and an LED chip. The encapsulant has a cavity located in a front end of the encapsulant. The carrier comprises a die pad, a heat spreader, and a plurality of leads. The die pad is disposed on the encapsulant and located in the cavity. The heat spreader is connected with the die pad, and passes through the encapsulant to extend outside the cavity, and further extends toward a rear end of the encapsulant. The leads pass through the encapsulant and extend outside the cavity. The LED chip is disposed on the die pad, and is electrically connected to the leads.

In one embodiment of the present invention, the die pad is connected to one of the leads.

In one embodiment of the present invention, the die pad is electrically insulated from the leads.

In one embodiment of the present invention, a rear end of the encapsulant has a first surface, a second surface, and a third surface. The second surface is opposite to a bottom surface of the cavity, the first surface is opposite to the third surface, and the first surface and the third surface are adjacent to the second surface. A portion of the heat spreader outside the cavity is disposed corresponding to the first surface.

In one embodiment of the present invention, the portion of the heat spreader outside the cavity is disposed corresponding to the first surface and the second surface.

In one embodiment of the present invention, the portion of the heat spreader outside the cavity is disposed corresponding to the first surface and the third surface.

In one embodiment of the present invention, the portion of the heat spreader outside the cavity is disposed to surround the first surface, the second surface, and the third surface.

In one embodiment of the present invention, the LED chip is a red LED chip, a green LED chip, or a blue LED chip.

In one embodiment of the present invention, the LED package structure further comprises at least a bonding wire, and at least one of the leads is electrically connected to the LED chip through the bonding wire.

In one embodiment of the present invention, the LED package structure further comprises a transparent colloid. The transparent colloid is filled in the cavity, for encapsulating the LED chip, a portion of the die pad, and a portion of the leads exposed by the cavity.

In the present invention, the die pad is connected to the heat spreader, and a large surface area of the heat spreader is exposed outside the encapsulant. Therefore, the heat generated when the LED chip emits the light is conducted to the heat spreader through the die pad, so as to conduct the heat out of the encapsulant, and further to reduce the temperature of the LED chip. Moreover, as the heat spreader is disposed in the rear end instead of the front end of the encapsulant, when the light provided by the LED chip is irradiated on the front end of the encapsulant and the temperature of the front end of the encapsulant rises, the heat of the front end of the encapsulant is not directly transferred to the heat spreader. Thus, the heat dissipation efficiency of the heat spreader will not be influenced. In addition, the heat dissipation efficiency of the heat spreader can be further improved by increasing the surface area exposed outside the encapsulant, so as to extend the lifetime of the LED chip.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a schematic side view of a SMD type LED package structure according to the fourth embodiment of the present invention.

FIG. 6 is a schematic side view of a SMD type LED package structure according to the fifth embodiment of the present invention.

DESCRIPTION OF EMBODIMENTS

Figure 1A:
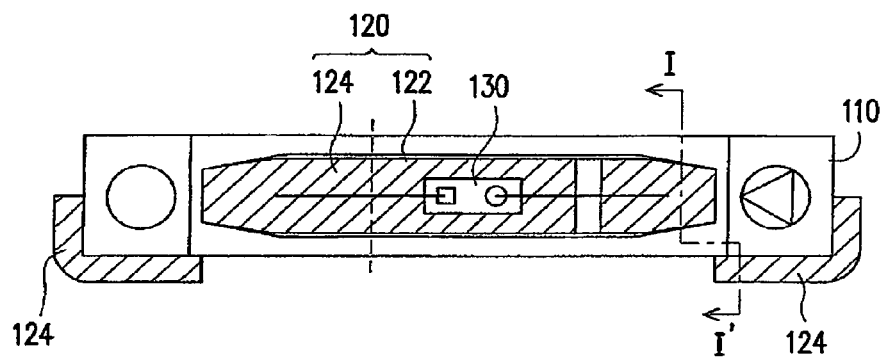
FIG. 1A is a schematic front view of a conventional SMD type LED package structure.
Figure 1B:
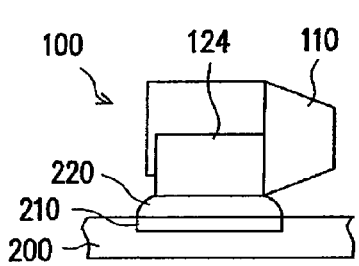
FIG. 1B is a schematic side view of FIG. 1A.
Figure 1C:
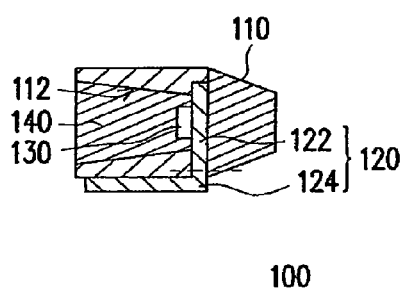
FIG. 1C is a schematic sectional view taken along a section line I-I' of FIG. 1A.
Figure 2A:
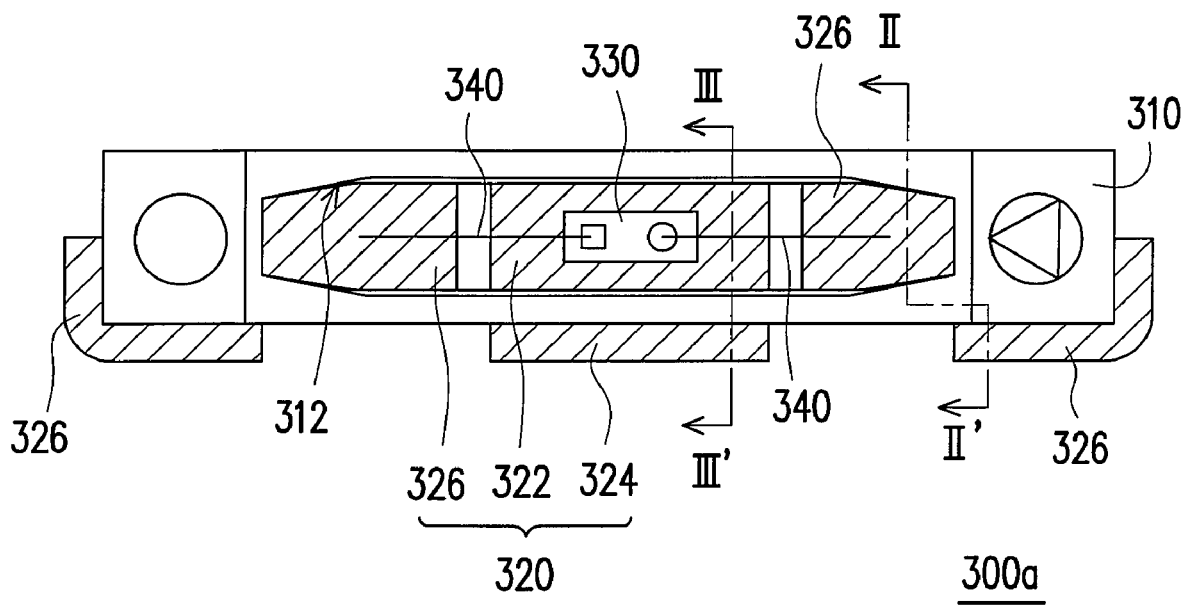
FIG. 2A is a schematic front view of a SMD type LED package structure according to the first embodiment of the present invention.
Figure 2B:
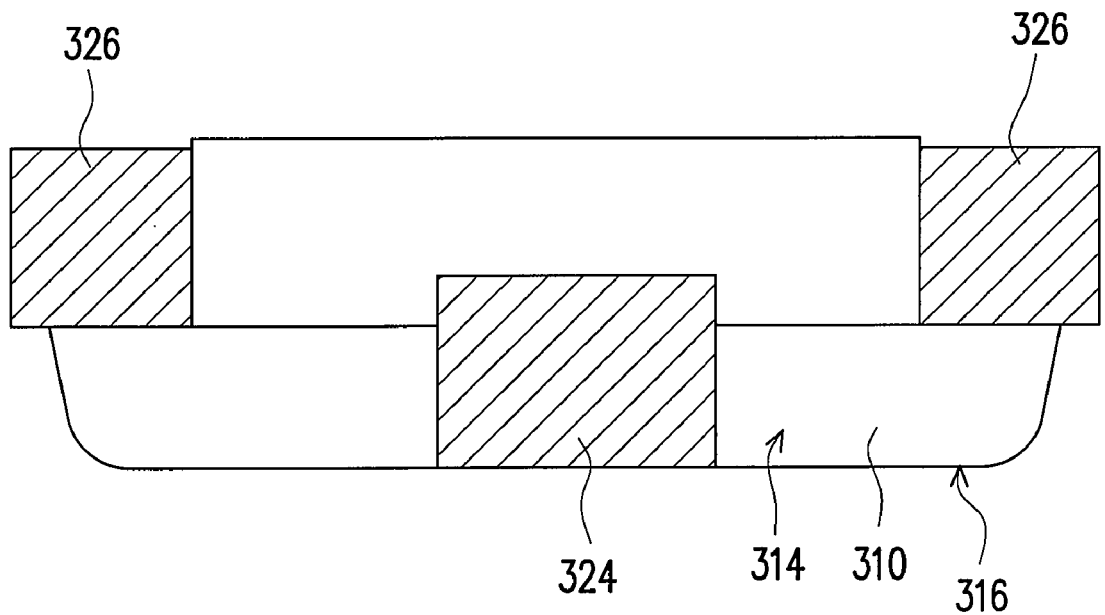
FIG. 2B is a schematic bottom view of FIG. 2A.
Figure 2C:
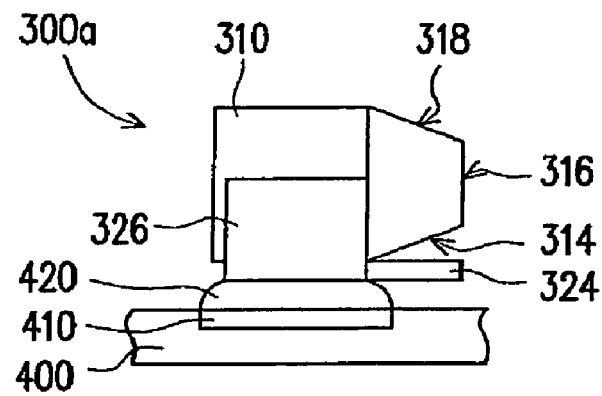
FIG. 2C is a schematic side view of FIG. 2A.
Figure 2D:
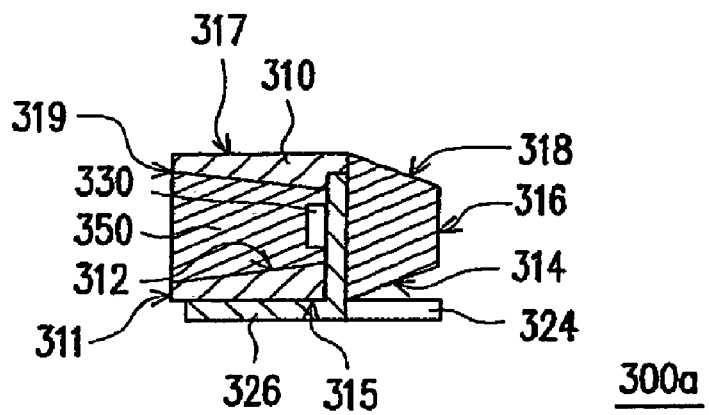
FIG. 2D is a schematic sectional view taken along a section line II-II' of FIG. 2A.
Figure 2E:
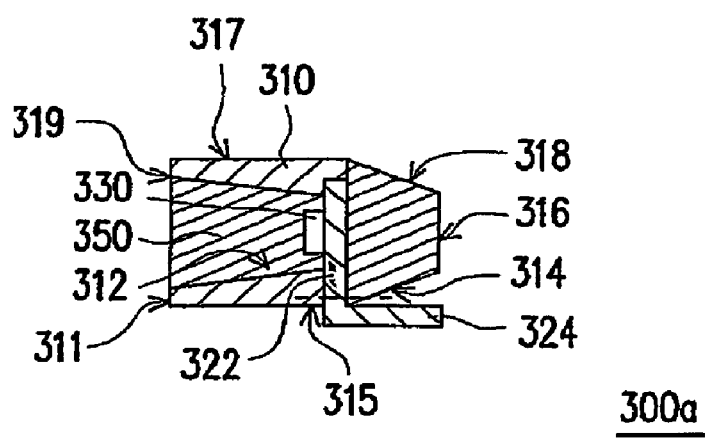
FIG. 2E is a schematic sectional view taken along a section line III-III' of FIG. 2A.

FIGS. 2A-2C are a schematic front view, a schematic bottom view, and a schematic side view of a SMD type LED package structure of the first embodiment of the present invention, and FIGS. 2D and 2E are schematic sectional views taken along section lines II-II' and III-III' of FIG. 2A respectively. Referring to FIGS. 2A to 2E, the LED package structure 300a includes an encapsulant 310, a carrier 320, and an LED chip 330. The encapsulant 310 has a front surface 311, a back surface 316, a bottom surface 315 and a cavity 312. The front surface 311 is located at a front end of the encapsulant 310 and has an opening 319. The back surface 316 is opposite to the front surface 311. The bottom surface 315 is connected between the front surface 311 and the back surface 316. The cavity 312 is located in the front end of the encapsulant 310 and communicates with the outside of the encapsulant 310 through the opening 319. The carrier 320 comprises a die pad 322, a heat spreader 324, and a plurality of leads 326. The die pad 322 is disposed on the encapsulant 310 and located in the cavity 312. The heat spreader 324 is connected with the die pad 322. The heat spreader 324 passes through the encapsulant 310 and the bottom surface 315 to extend outside the cavity 312 and the encapsulant 310, and further bends and extends toward a rear end of the encapsulant 310 opposite to the front end of the encapsulant 310. The leads 326 pass through the encapsulant 310 and the bottom surface 315 to extend outside the cavity 312 and the encapsulant 310. The leads 326 further bend and extend toward the front end of the encapsulant 310, and cover a part of the bottom surface 315. The LED chip 330 is disposed on the die pad 322, and is electrically connected to the leads 326.

In this embodiment, the LED chip 330 is, for example, one of a red LED chip, a green LED chip, or a blue LED chip, and the number of leads 326 is two. However, the present invention is not limited to this embodiment. For example, the number of LED chip 330 can be multiple, which include at least one of the read LED chip, the green LED chip, or the blue LED chip. At this time, the number of the die pad 322, the heat spreader 324, and the leads 326 can be adjusted corresponding to the number of the LED chips 330.

In other words, the number of the die pad 322 can be one, such that the LED chips 330 are disposed on the same die pad 322. Or, the die pads 322 can be multiple, such that the LED chips 330 are suitable for being disposed on different die pads 322. Similarly, the number of the heat spreaders 324 can be one or multiple, such that the die pads 322 are suitable for being connected to the same or different heat spreaders 324. Moreover, the number of the leads 326 can be two, such that the LED chips 330 are electrically connected to the same leads 326. Or, the number of the LED chips 330 can be more than two, such that the LED chips 330 are electrically connected to two of the leads 326 respectively.

In addition, the die pads 322 and the heat spreaders 324, for example, are integrated into one piece. The material of the die pads 322 and the heat spreaders 324 is, for example, Ag, Cu, or AlN. A metal material such as Ni, Ag, Al, Pt, Pd, or Au can be plated on the surface of the die pads 322 and the heat spreaders 324 to improve the thermal conductance. Therefore, the heat generated by the LED chip 330 can be rapidly conducted to the heat spreader 324 through the die pad 322, so as to improve the heat dissipation efficiency of the LED chip 330.

Furthermore, in this embodiment, the die pad 322, for example, is electrically insulated from the leads 326, and the LED chip 330 is electrically connected to the leads 326 through a wire bonding technology. In detail, the LED package structure 300a further includes at least a bonding wire 340, and the leads 326 for example, are electrically connected to the LED chip 330 through the bonding wires 340. The bonding wires 340, for example, are gold lines, aluminum lines, copper lines, or other applicable metal lines, and the leads 326, for example, is of a metal material, which can be plated with a metal material such as Ni, Ag, Al, Pt, Pd, or Au on the surface.

Furthermore, the encapsulant 310, for example, is fabricated by injection molding, and the portion of the leads 326 outside the cavity 312 and the portion of the heat spreader 324 outside the cavity 312 are, for example, disposed on a same side of the encapsulant 310. In more detail, the encapsulant 310 further has a first surface 314 at the rear end of the encapsulant 310 and a second surface 318 at the rear end of the encansulant 310. The back surface 316 is opposite to a bottom surface of the cavity 312 facing the front end of the encapsulant 310, the first surface 314 is opposite to the second surface 318, the back surface 316 is connected between the first surface 314 and the second surface 318, and the first surface 314 is connected between the back surface 316 and the bottom surface 315 of the encapsulant 310. Moreover, the encapsulant 310 has a top surface 317 opposite to the bottom surface 315, and the top surface 317 is connected between the front surface 311 and the second surface 318. More specifically, the bottom surface 315 of the front end of the encapsulant 310 is adjacent to the first surface 314, and the top surface 317 is adjacent to the second surface 318. The portions of the leads 326 outside the cavity 312 cover the bottom surface 315 of the front end of the encapsulant 310, and the first surface 314 faces the portion of the heat spreader 324 outside the encapsulant 310. Therefore, when the leads 326 of the LED package structure 300a is connected to a contact 410 of a substrate 400 through a connector 420, the heat spreader 324 is disposed between the encapsulant 310 and the substrate 400. The contact 410 is, for example, a bonding pad, and the connector 420 is, for example, solder material, silver paste, or other conductive materials.

However, the present invention is not limited to this embodiment. For example, the portion of the heat spreader 324 outside the cavity 312 can be disposed corresponding to the third surface 318, such that the portion of the leads 326 outside the cavity 312 is disposed on different sides.

In addition, the LED package structure 300a can further include a transparent colloid 350 filled in the cavity 312, so as to encapsulate the LED chip 330, the portion of the die pad 322, and the portion of the leads 326 exposed by the cavity 312. The material of the transparent colloid 350 is, for example, epoxy resin, silicone, or a UV-cured adhesive. Furthermore, a fluorescent powder can be mixed in the transparent colloid 350, so as to change the color of the light provided by the LED chip 330. For example, the LED chip 330 can be a purple LED chip, and the red fluorescent powder, green fluorescent powder, or blue fluorescent powder can be mixed in the transparent colloid 350, such that the LED package structure 300a emits red, green, or blue light. Certainly, the red fluorescent powder, green fluorescent powder, and blue fluorescent powder can be mixed in the transparent colloid 350 at an appropriate proportion, such that the LED package structure 300a emits white light.

In the present invention, as most portion of the heat spreader 324 is exposed out of the encapsulant 310, the heat generated when the LED chip 330 emits light can be conducted to the heat spreader 324 through the die pad 322, so as to conduct the heat out of the encapsulant 310. As the surface area of the heat spreader 324 exposed outside the encapsulant 310 is larger than the surface area of the leads 326 exposed outside the encapsulant 310, compared with the conventional art that uses the leads 326 to dissipate the heat, the present invention that uses the heat spreader 324 to dissipate the heat has higher efficiency. Moreover, as the heat spreader 324 is disposed at the rear end instead of the front end of the encapsulant 310, when the light provided by the LED chip 330 is irradiated on the front end of the encapsulant 310 and the temperature of the front end of the encapsulant 310 rises, the heat of the front end of the encapsulant 310 is not directly transferred to the heat spreader 324. Thus, the heat dissipation efficiency of the heat spreader 324 will not be influenced. In addition, the heat dissipation efficiency of the heat spreader 324 can be further improved by increasing the surface area, so as to extend the lifetime of the LED chip 330. Here, several embodiments will be given below to illustrate the methods for improving the heat dissipation efficiency of the heat spreader 324 by increasing the surface area of the heat spreader 324 exposed outside the encapsulant 310.

Figure 3:
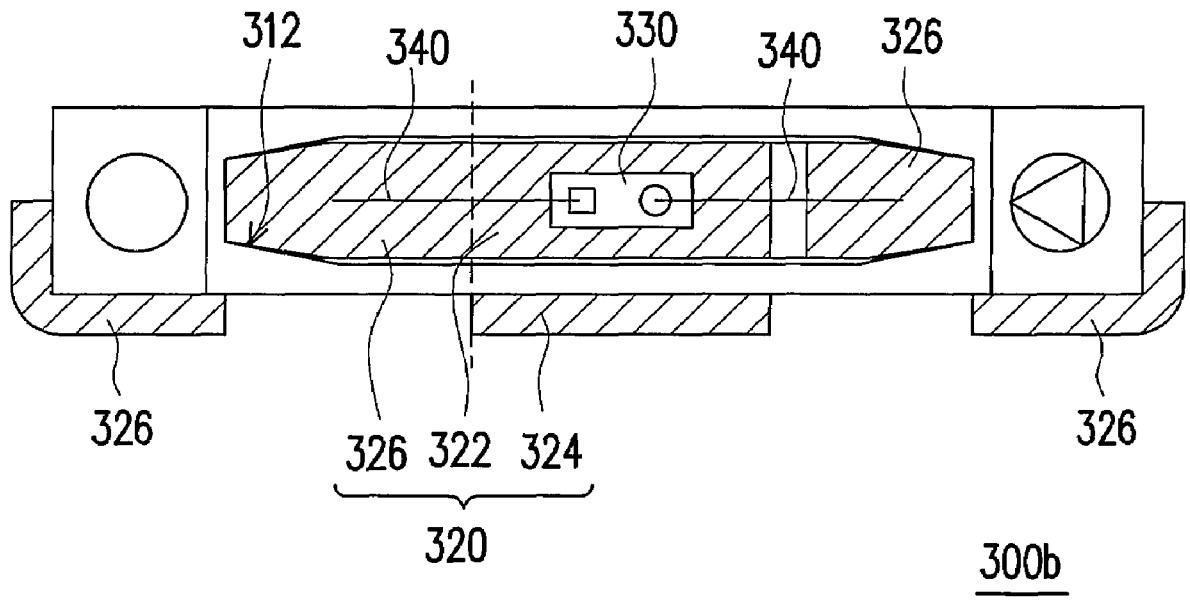
FIG. 3 is a schematic front view of a SMD type LED package structure according to the second embodiment of the present invention.

FIG. 3 is a schematic front view of a SMD type LED package structure according to the second embodiment of the present invention. Referring to FIG. 3, the LED package structure 300b is substantially the same as that of the LED package structure 300a of FIG. 2A in structure, except that the die pad 322 is connected to one of the leads 326, and the die pad 322, the heat spreader 324, and the leads 326 connected to the die pad 322 are, for example, integrated into one piece.

In this embodiment, as the heat generated when the LED chip 330 emits light can be conducted to the heat spreader 324 and the leads 326 connected with the die pad 322 through the die pad 322 at the same time, so as to conduct the heat out of the encapsulant 310. Therefore, the heat dissipation efficiency of this embodiment is higher.

Moreover, the heat spreader 324 is connected to one of the leads 326. Therefore, in addition to being electrically connected to the leads 326 with the wire bonding technology, the LED chip 330 can also be electrically connected to the leads 326 by both the wire bonding technology and the flip chip bonding technology. In other words, the LED chip can be electrically connected to the lead 326 connected with the die pad 322 through the heat spreader 324 by the flip chip bonding technology, and be electrically connected to another lead 326 by the wire bonding technology.

Figure 4:
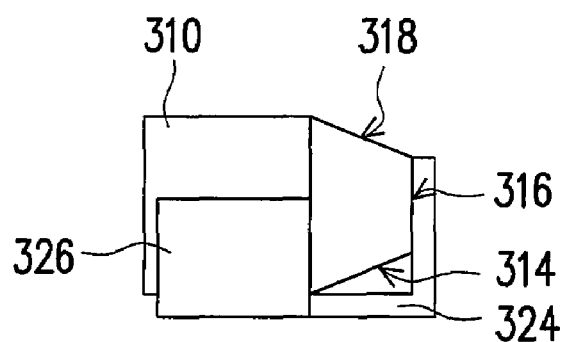
FIG. 4 is a schematic side view of a SMD type LED package structure according to the third embodiment of the present invention.

FIGS. 4, 5, and 6 are schematic side views of a SMD type LED package structure according to the third, fourth, and fifth embodiments of the present invention respectively. Referring to FIGS. 4-6, the LED package structures 300c, 300d, and 300e are substantially the same as the LED package structure 300a of FIG. 2A in structure, but are different in term of the arrangement of the heat spreader 324.

In FIG. 4, the first surface 314 faces one portion of the heat spreader 324 outside the encapsulant 310, and the back surface 316 faces another portion of the heat spreader 324 outside the encapsulant 310, for example. In FIG. 5, the heat spreader 324 also passes through the top surface 317 to extend outside the encapsulant 310 and further bends and extends toward the rear end of the encapsulant 310. Moreover, the first surface 314 faces one portion of the heat spreader 324 outside the encapsulant 310, and the second surface 318 faces another portion of the heat spreader 324 outside the encapsulant 310, for example. In addition, in FIG. 6, the portion of the heat spreader 324 outside the encapsulant 310 is, for example, disposed to surround the first surface 314, the back surface 316, and the second surface 318. The first surface 314, the back surface 316, and the second surface 318 face three portions of the heat spreader 324 outside the encapsulant 310, respectively.

It is known that in the above embodiments, the portion of the heat spreader 324 outside the cavity 312 not only can be disposed corresponding to the first surface 314 as shown in FIG. 2C, but also can further extend towards any direction, so as to increase the surface area of the heat spreader 324 outside the encapsulant 310, and further to improve the heat dissipation efficiency of the heat spreader 324.

To sum up, the LED package structure of the present invention has the following advantages.

1. In the present invention, as the surface area of the heat spreader exposed outside the encapsulant is larger than the surface area of the leads exposed outside the encapsulant, the LED chip using the heat spreader has better heat dissipation efficiency.

2. In the present invention, as the heat spreader is disposed in the rear end instead of the front end of the encapsulant, when the light provided by the LED chip is irradiated on the front end of the encapsulant and the temperature of the front end of the encapsulant rises, the heat of the front end of the encapsulant is not directly transferred to the heat spreader. Thus, the heat dissipation effect of the heat spreader will not be influenced.

3. The surface area of the heat spreader of the present invention exposed outside the encapsulant can be increased by connecting one of the leads or by other means, so as to improve the heat dissipation efficiency.

4. The present invention has higher heat dissipation efficiency, so the lifetime of the LED chip is longer.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LED package structure, comprising:
    an encapsulant, having:
        a front surface located at a front end of the encapsulant and having an opening;
        a back surface opposite to the front surface;
        a bottom surface connected between the front surface and the back surface; and
        a cavity located in the front end of the encapsulant and communicating with the outside of the encapsulant through the opening;
    a carrier, comprising:
        a die pad, disposed on the encapsulant and located in the cavity;
        a heat spreader, connected with the die pad, the heat spreader passing through the encapsulant and the bottom surface to extend outside the cavity and the encapsulant, and further bending and extending toward a rear end of the encapsulant opposite to the front end;
        a plurality of leads, passing through the encapsulant and the bottom surface to extend outside the cavity and the encapsulant, further bending and extending toward the front end of the encapsulant, and covering a part of the bottom surface; and
    an LED chip, disposed on the die pad, and electrically connected to the leads.

2. The LED package structure as claimed in claim 1, wherein the die pad is connected to one of the leads.

3. The LED package structure as claimed in claim 1, wherein the die pad is electrically insulated from the leads.

4. The LED package structure as claimed in claim 1, wherein the encapsulant further has a first surface at the rear end of the encapsulant and a second surface at the rear end of the encapsulant, the back surface is opposite to a bottom surface of the cavity facing the front end, the first surface is opposite to the second surface, the back surface is connected between the first surface and the second surface, the first surface is connected between the back surface and the bottom surface of the encapsulant, and the first surface faces a portion of the heat spreader outside the encapsulant.

5. The LED package structure as claimed in claim 4, wherein The back surface faces another portion of the heat spreader outside the encapsulant.

6. The LED package structure as claimed in claim 4, wherein the encapsulant has a top surface opposite to the bottom surface, the top surface is connected between the front surface and the second surface, the heat spreader also passes through the top surface to extend outside the encapsulant and further bends and extends toward the rear end of the encapsulant, and the second surface faces another portion of the heat spreader outside the encapsulant.

7. The LED package structure as claimed in claim 4, wherein the portion of the heat spreader outside the encapsulant is disposed to surround the first surface, the back surface, and the third surface; the first surface, the back surface, and the second surface face three portions of the heat spreader outside the encapsulant, respectively.

8. The LED package structure as claimed in claim 1, wherein the LED chip is a red LED chip, a green LED chip, or a blue LED chip.

9. The LED package structure as claimed in claim 1, further comprising at least a bonding wire, wherein at least one of the leads is electrically connected to the LED chip through the bonding wire.

10. The LED package structure as claimed in claim 1, further comprising a transparent colloid filled in the cavity, so as to encapsulate the LED chip, a portion of the die pad, and a portion of the leads exposed by the cavity.

* * * * *